(12) United States Patent  
Ikenaga et al.

(10) Patent No.: US 6,744,118 B2  
(45) Date of Patent: Jun. 1, 2004

(54) FRAME FOR SEMICONDUCTOR PACKAGE

(75) Inventors: Chikao Ikenaga, Tokyo (JP); Kouji Tomita, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 62 days.

(21) Appl. No.: 09/850,212

(22) Filed: May 7, 2001

(65) Prior Publication Data

US 2001/0042904 A1 Nov. 22, 2001

(30) Foreign Application Priority Data

May 9, 2000 (JP) ........................................ 2000-135336

(51) Int. Cl.$^7$ ............................................ H01L 23/495
(52) U.S. Cl. .................. 257/666; 257/667; 257/669; 257/673; 257/676; 257/773; 257/787; 257/797; 438/123; 438/124
(58) Field of Search ................................ 257/666, 667, 257/669, 673, 676, 787, 797, 773; 438/123, 124

(56) References Cited

U.S. PATENT DOCUMENTS

| 4,862,246 | A | * | 8/1989 | Masuda et al. ............... 357/70 |
| 5,293,066 | A | | 3/1994 | Tsumura |
| 5,633,205 | A | | 5/1997 | Tsuchiya et al. |
| 5,753,535 | A | | 5/1998 | Ebihara |
| 5,767,566 | A | | 6/1998 | Suda |
| 5,942,794 | A | | 8/1999 | Okumura et al. |
| 5,969,412 | A | * | 10/1999 | Matsutomo ................. 257/670 |
| 5,977,615 | A | | 11/1999 | Yamaguchi et al. |
| 6,020,625 | A | | 2/2000 | Qin et al. |
| 6,100,598 | A | | 8/2000 | Kanesaka |
| 6,175,150 | B1 | | 1/2001 | Ichikawa et al. |
| 6,191,494 | B1 | | 2/2001 | Ooyama et al. |
| 6,229,200 | B1 | | 5/2001 | Mclellan et al. |
| 6,242,281 | B1 | * | 6/2001 | Mclellan et al. ............. 438/106 |
| 6,246,106 | B1 | * | 6/2001 | Sugimoto et al. ........... 257/666 |
| 6,300,224 | B1 | * | 10/2001 | Arima et al. ................ 438/462 |
| 6,355,502 | B1 | | 3/2002 | Kang et al. |
| 6,400,004 | B1 | | 6/2002 | Fan et al. |
| 2001/0030355 | A1 | * | 10/2001 | Mclellan ..................... 257/666 |
| 2001/0040276 | A1 | * | 11/2001 | Yasunaga et al. ........... 257/670 |
| 2002/0189835 | A1 | | 12/2002 | Miyaki et al. |

OTHER PUBLICATIONS

Copy of U.S. application Ser. No. 09/850 213, filed May 7, 2001, Chikao Ikenaga and Kouji Tomita, Inventors, Including specification, claims and drawings.

* cited by examiner

Primary Examiner—Allan R. Wilson
Assistant Examiner—Edgardo Ortiz
(74) Attorney, Agent, or Firm—Flynn, Thiel, Boutell & Tanis, P.C.

(57) ABSTRACT

A frame for a semiconductor package includes plural lead frames arranged through grid-leads in a matrix. Semiconductor devices are mounted on individual lead frames of the frame, and are molded with molding compound. Thereafter, the molded semiconductor devices are cut at grid-leads by means of a dicing saw so that individual semiconductor packages are obtained. The frame further has groove portions which are formed by etching the frame from the front or back at areas corresponding to grid-leads, so that the grid-leads are made thin which reduces burrs and the generation of metal powders and dust.

27 Claims, 7 Drawing Sheets

FRAME FOR SEMICONDUCTOR PACKAGE

BACKGROUND OF THE INVENTION

1. Field of the Invention

The present invention relates to a frame for semiconductor package in which a semiconductor device is mounted on a lead frame and the outside thereof, particularly the upper surface of semiconductor device is encapsulated with molding compound.

2. Description of the Prior Art

In recent years, it has been required to miniaturize and shape semiconductor products mounted on a substrate so as to be thinner, as the packaging of a semiconductor is more dense. It is also required for LSI to reduce the number of chips by improving integration level and to miniaturize and make a package lighter. The popularization of so-called CSP (Chip Size Package) is rapidly advancing. Particularly, in the development of a thin semiconductor product with a lead frame, the semiconductor package of the single side encapsulation type has been developed in which a semiconductor device is mounted on a lead frame and the surface of the semiconductor device mounted on a lead frame is encapsulated with molding compound.

FIG. 1 is a sectional view of one example of a semiconductor package. FIG. 2 is a plan view thereof. The semiconductor package shown in FIGS. 1 and 2 is comprised of a lead frame 1, a semiconductor device 4 mounted on die-pad 3 supported with suspending leads 2 of lead frame 1, metallic thin wires 6 electrically connecting electrodes provided on the top face of the semiconductor device 4 with terminals 5 of lead frame 1, and molding compound 7 for encapsulating the outside region of semiconductor device 4 including the upper side of semiconductor device 4 and the lower side of die-pad 3. The semiconductor package is of the non-lead type in which so-called outer leads do not project from the semiconductor package and the two inner leads and outer leads are integrated into terminals 5, wherein used lead frame 1 is half-cut by etching in such a manner that die-pad 3 is positioned higher than terminals 5. Since such a step is formed between die pads 3 and terminals 5, molding compound 7 can be inserted into the lower side of die-pad 3 so that a thin semiconductor package can be realized even though the semiconductor package has a non-exposed die-pad.

Since the semiconductor device is miniature, a matrix type frame is mainly used for the above-mentioned semiconductor package of the non-lead type, in which plural semiconductor devices are arranged in a direction of a width of the matrix type frame. Further, recently, due to a demand for lower costs, one thought is to switch from a frame with individual-type molding shown in FIGS. 3A and 3B to a frame with collective-type molding as shown in FIGS. 4A and 4B.

In the frame shown in FIG. 3(A), individual molding cavities C of small size are provided separately within a frame F. After molding, individual semiconductor packages are stamped out so that semiconductor packages S shown in FIG. 3(B) are obtained. Namely, semiconductor devices are mounted on die-pads of lead frames through silver paste and others, and wire bonding is carried out. Thereafter, respective semiconductor devices are individually molded with molding compound and the respective molded semiconductor devices are stamped out to form individual semiconductor packages.

In the frame of the collective molding type, as shown in FIG. 4(A), some molding cavities C of large size are provided within a frame F. Multiple semiconductor devices are arranged in a matrix within each molding cavity C, respectively and collectively molded with molding compound. Thereafter, the collectively molded semiconductor devices are cut at grid-leads L by means of a dicing saw so that a semiconductor package S shown in FIG. 4(B) is obtained. Namely, semiconductor devices are mounted on die-pads of lead frames through silver pastes and others and wire bonding is carried out. Thereafter, plural semiconductor devices are collectively molded with molding compound to a given cavity size, and then the collectively molded semiconductor devices are cut to form individual semiconductor packages by dicing.

The above-mentioned frame of the collective molding type has the advantage that multiple resin-encapsulated packages can be produced all at once, therefore the productive efficiency is high. However, when collectively molded semiconductor devices are cut to form individual packages by means of a dicing saw, molding compound and metallic lead frames are cut at the same time, and burrs of metal from the lead frame project a long distance towards adjacent terminals which causes short circuiting. Further, there is a problem that metal powders and dust are generated and pollute the environment. Further, the dicing saw is apt to wear out since metal is shaved with the dicing saw.

BRIEF SUMMARY OF THE INVENTION

An object of the present invention is to provide a frame for a semiconductor package of the collective molding type used for the production of a semiconductor package, in which burrs of metal generated when cutting molded resin and metal of the lead frame by means of a dicing saw are reduced and the generation of metal dust is inhibited, and the wear of the dicing saw is reduced.

In order to achieve the above-mentioned object, a frame for a semiconductor package of the present invention comprises plural lead frames arranged in a matrix through grid-leads, in which individual semiconductor devices are mounted on the individual lead frames, respectively, the semiconductor devices are collectively molded with molding compound and the collectively molded semiconductor devices are cut at grid-leads by means of a dicing saw to obtain individual semiconductor packages, wherein the grid-leads are provided with groove portions which are formed by half-cutting by etching areas of the frame for the semiconductor package corresponding to the grid-leads from the front or back thereof in such a manner that thin grid-leads are formed.

In the above-mentioned lead frame, a width of groove portions may be larger or smaller than the width of the dicing saw.

DETAILED DESCRIPTION

Figure 1:
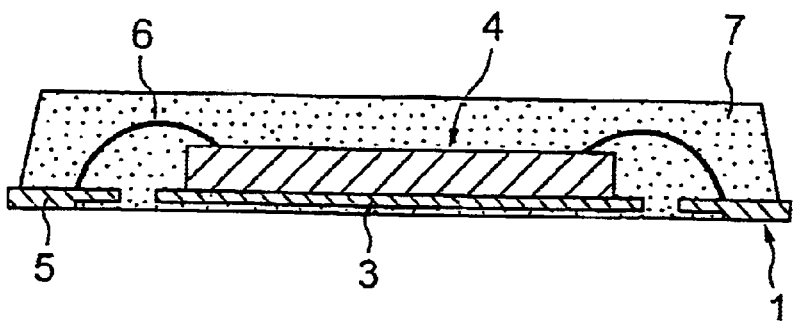
FIG. 1 is a sectional view of one example of a semiconductor package.
Figure 2:
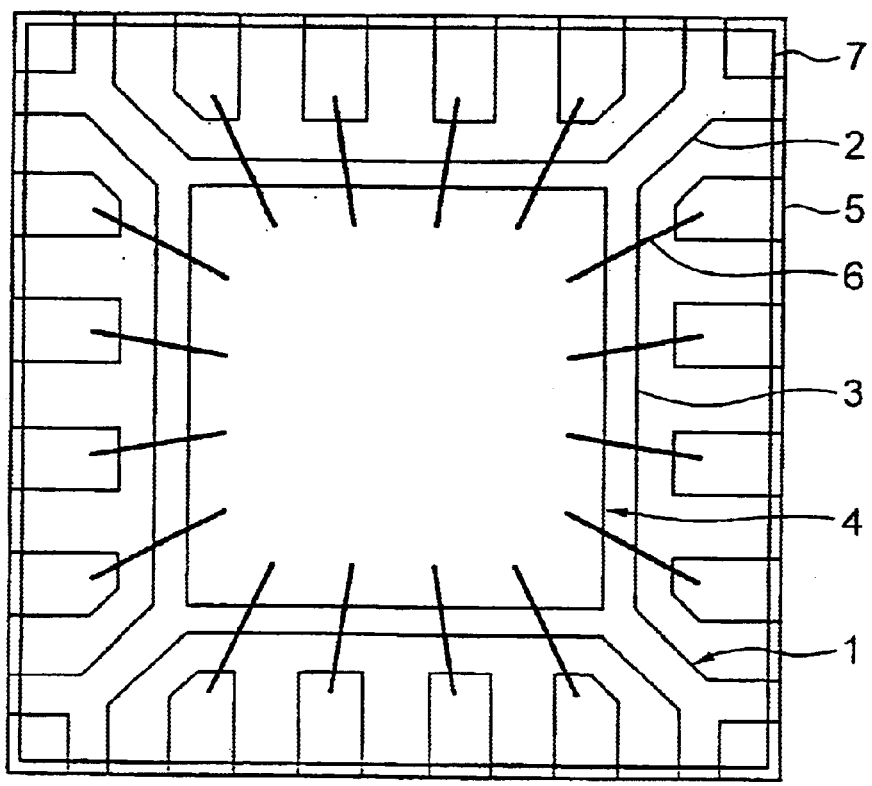
FIG. 2 is a plan view of the semiconductor package shown in FIG. 1.
Figure 3A:
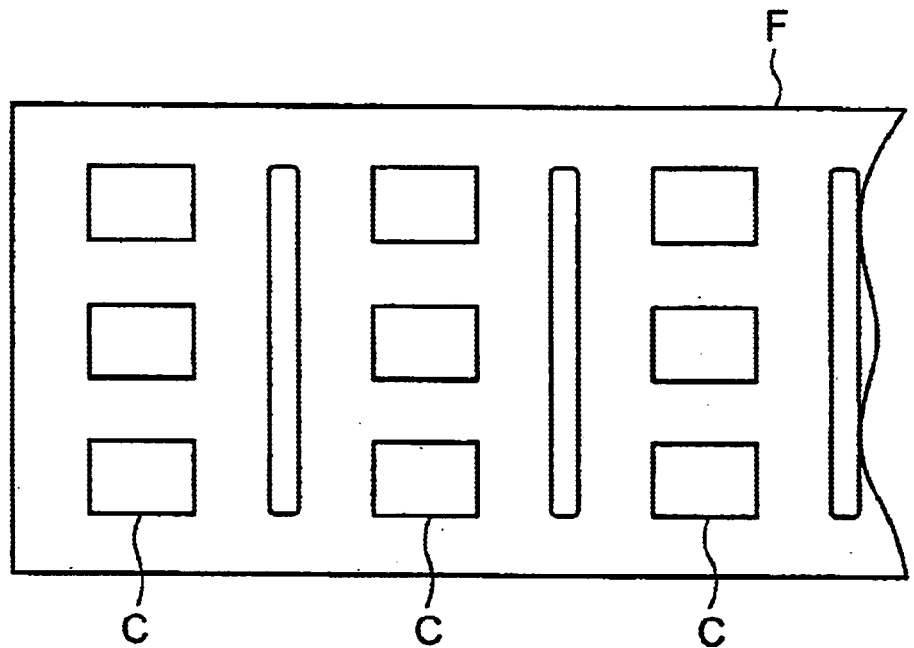
FIG. 3 is an explanatory view of a frame of the individual molding type.
Figure 3B:
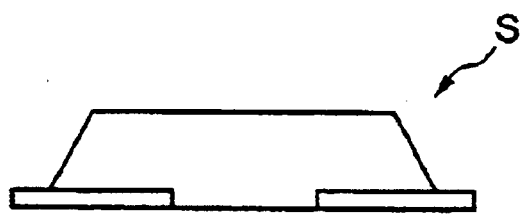
Figure 4A:
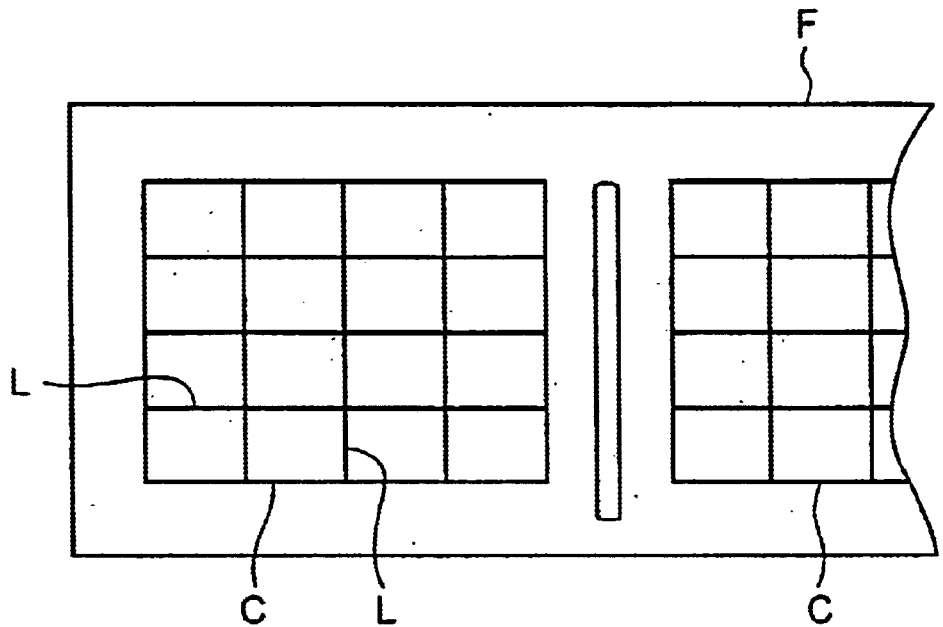
FIG. 4 is an explanatory view of a frame of the collective molding type.
Figure 4B:
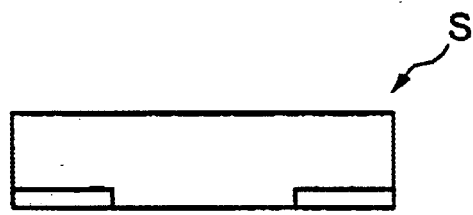
Figure 5:
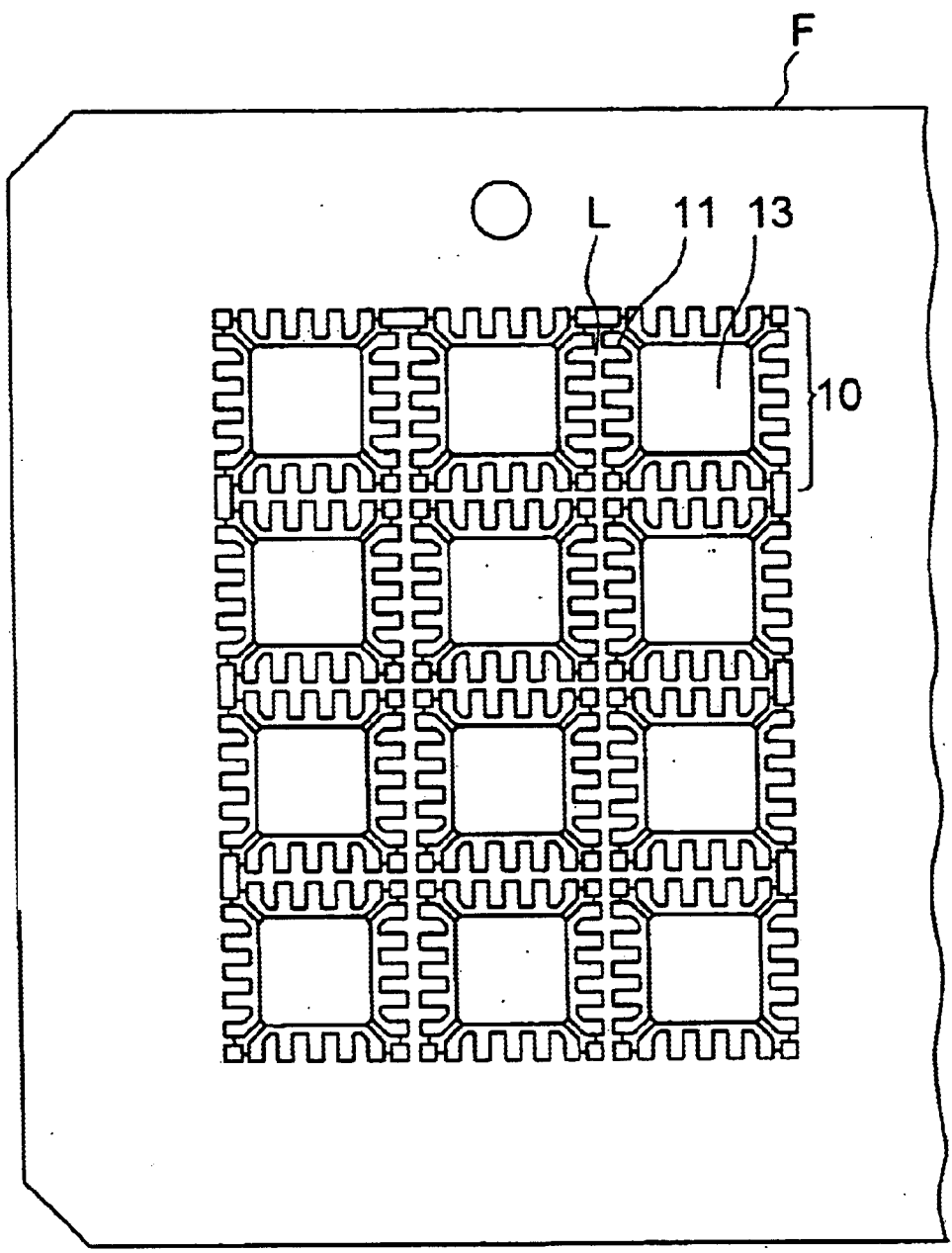
FIG. 5 is a plan view of one example of a frame of the present invention seen from the front side thereof.
Figure 6:
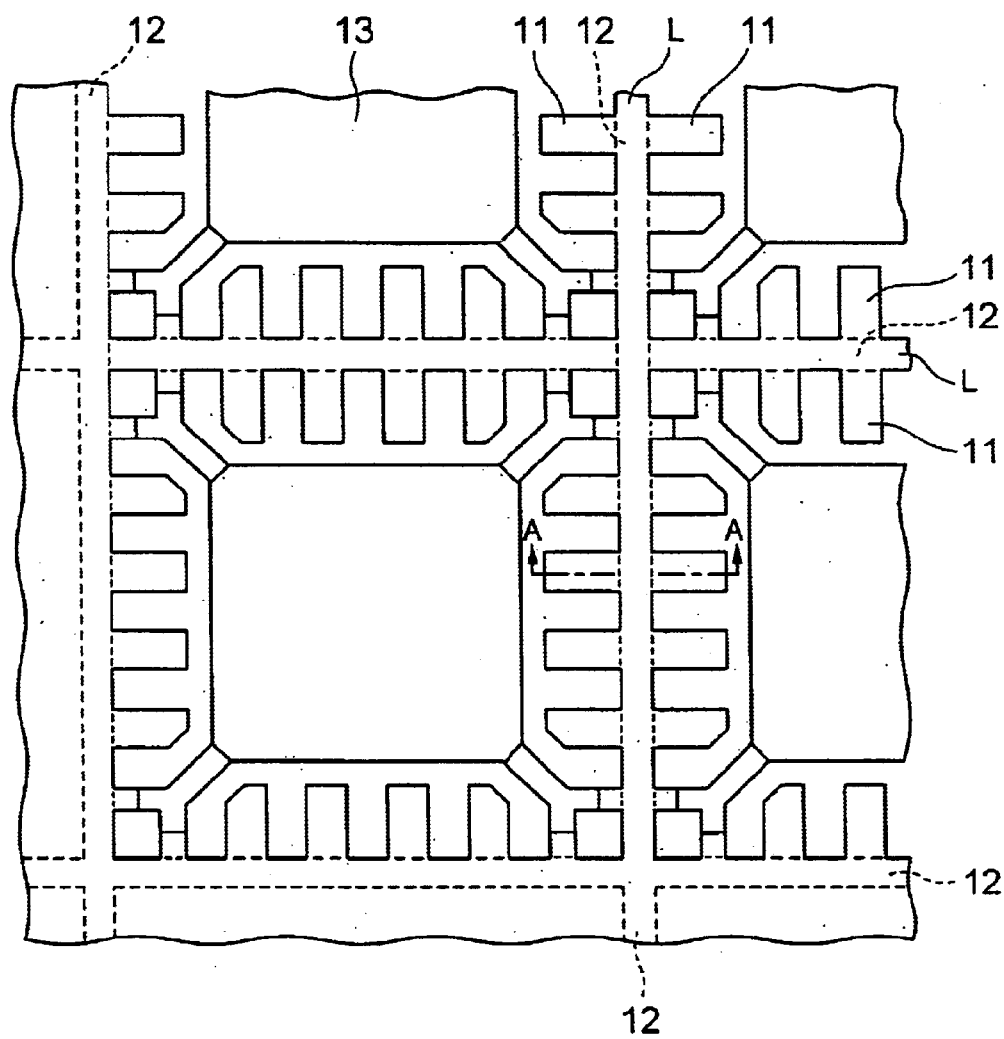
FIG. 6 is a partial enlarged plan view of a frame shown in FIG. 5.
Figure 7:
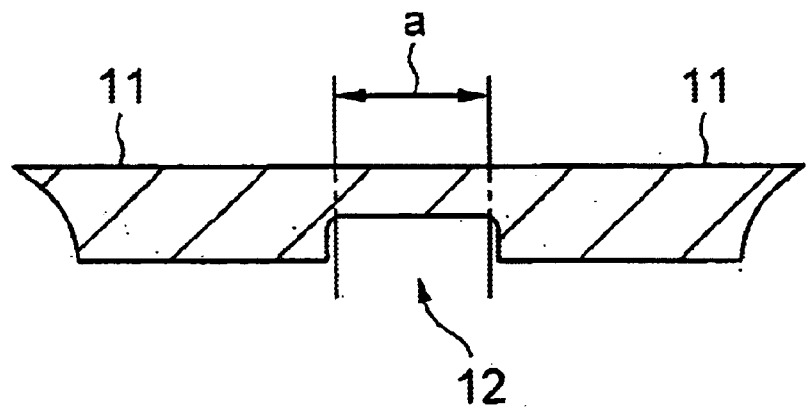
FIG. 7 is a sectional view taken on line A—A of FIG. 6.

Referring to the figures, embodiments of the present invention are explained. FIG. 5 is a plan view of one example of a frame of the present invention. FIG. 6 is a partial enlarged plan view of the frame. FIG. 7 is a sectional view taken on line A—A of FIG. 6.

In FIG. 5, F designates a metal frame, in which lead frames 10 are arranged in a matrix of 3×4 through grid-leads L. The grid-leads L connect terminals 11 of adjacent lead frames 10 with each other. Then, as shown in FIGS. 6 and 7, the metal frame has linear groove portions 12 which pass through areas of the backside of lead frame corresponding to grid-leads L. The groove portions 12 are formed by half-etching the metal frame. Further, groove portions 12 with the same width are provided around the whole of twelve lead frames.

The process for producing semiconductor packages using the frame F is as follows. First, semiconductor devices are mounted on die-pads 13 of the respective lead frames 10 of frame F through silver pastes and wire bonding is made between terminals 11 of lead frame and electrodes provided on the top face of semiconductor devices. Thereafter, twelve semiconductor devices are collectively molded with molding compound to a given cavity size and then the collectively molded semiconductor devices are cut at grid-leads L by means of a dicing saw in such a manner that terminals 11 of individual lead frames are left, by which the collectively molded semiconductor devices are divided into individual semiconductor packages.

In this case, when a width of groove portions 12 is the same as a width of the dicing saw, there is a case where the edge of the dicing saw fits into groove potion 12 so that cutting does not go smoothly. Further, according to accuracy of setting of the dicing saw to groove portions 12, shapes of section of metal varies with individual sides so that variation in the connecting strength of the substrate is generated in mounting of the semiconductor device. Therefore, a width of groove portions 12 is set to be larger or smaller than a width of the dicing saw in such a manner that cutting can be carried out smoothly.

Figure 8:
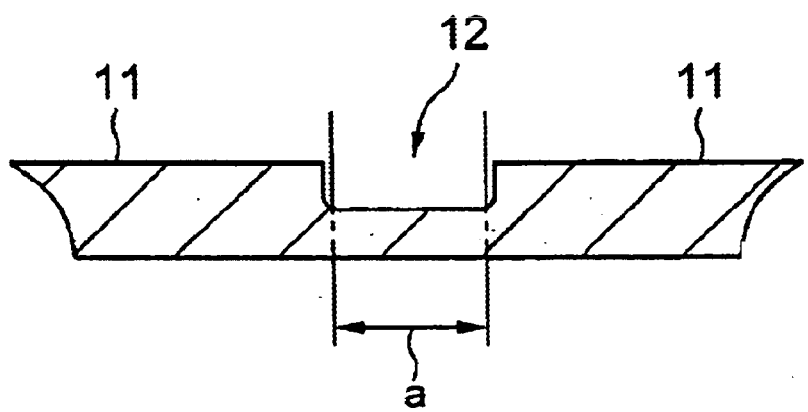
FIG. 8 is a sectional view similar to FIG. 7 showing a modification of the frame shown in FIG. 6.

When cutting the collectively molded semiconductor devices, metal and resin are cut at grid-leads L from the front side of the collectively molded semiconductor devices, in which when a groove width of portions 12 is larger than width "a" of the dicing saw as shown in FIG. 7, since metal is removed at groove portions 12, the generation of metal burrs is reduced. Further, even if groove portions 12 having a width larger than width "a" of the dicing saw are provided on the front side of the frame for the semiconductor packageas shown in FIG. 8, the occurrence of burrs is also reduced. However, since the collectively molded semiconductor devices are cut from the front side of the frame, it is preferable that groove portions 12 are provided on the backside of the frame.

Figure 9:
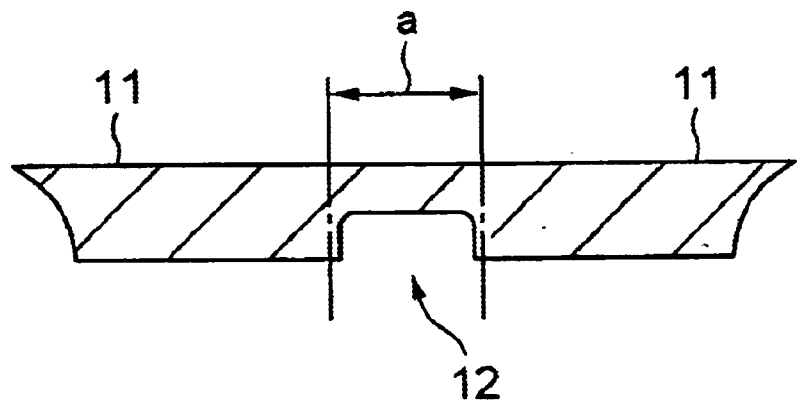
FIG. 9 is a sectional view similar to FIG. 7 of another modification of the frame shown in FIG. 7.
Figure 10:
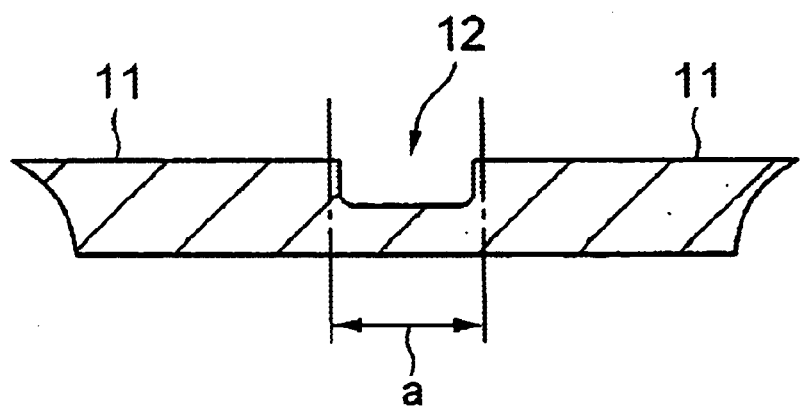
FIG. 10 is a sectional view similar to FIG. 7 showing a modification of the frame shown in FIG.9.

Further, when a width of groove portions 12 is smaller than width "a" of the dicing saw as shown in FIG. 9, burrs are generated. However, since the amount of metal to be cut is small, the generation of metal powder and dust is inhibited and even if time required for cutting is small, cutting can be done sufficiently.

As mentioned above, a frame for the semiconductor package of the present invention comprises plural lead frames arranged in a matrix through grid-leads. Individual semiconductor devices are mounted on the individual lead frames, respectively, the semiconductor devices are collectively molded with molding compound and the collectively molded semiconductor devices are cut at grid-leads by means of a dicing saw to obtain individual semiconductor packages. The grid-leads are provided with groove portions which are formed by half-cutting or half-etching areas of the frame for the semiconductor package to define groove portions from the front or back in such a manner that thin grid-leads are formed. When a width of the groove portions is larger than a width of the dicing saw, cross-sectional areas to be cut by dicing are decreased so that the generation of burrs is lessened to such an extent that the burrs do not project greatly. Therefore, accidental short circuiting is prevented. Further, when a width of groove portions is smaller than a width of the dicing saw, the amount of metal to be cut is decreased so that the generation of metal powder and dust is inhibited, the time required for cutting becomes smaller and damage to the dicing saw is lessened.

What is claimed is:

1. A frame for semiconductor packages comprising plural lead frames arranged in a matrix through metal grid-leads, in which individual semiconductor devices are respectively mounted on the individual lead frames, the semiconductor devices being collectively molded with molding compound and the collectively molded semiconductor devices are cut along the grid-leads by means of a dicing saw to obtain individual semiconductor packages, each said lead frame including terminals and said grid-leads interconnect terminals of adjacent lead frames to one another wherein the grid-leads along which the semiconductor devices are cut are provided with groove portions between interconnected terminals of adjacent lead frames so that thin grid-leads are formed to minimize the formation of burrs during cutting along the grid-leads.

2. A frame for semiconductor packages as claimed in claim 1, wherein the groove portions are formed by half-etching areas of the frame corresponding to the grid-leads from the front or back thereof.

3. A frame for semiconductor packages as claimed in claim 1, wherein a width of the groove portions is larger than a width of the dicing saw.

4. A frame for semiconductor packages as claimed in claim 1, wherein a width of the groove portions is smaller than a width of the dicing saw.

5. A frame for forming individual semi-conductor packages comprising a plurality of lead frames arranged in a mutually-adjacent array formation, each of said lead frames mounting thereon a semi-conductor device covered in molding compound and each said lead frame being defined at its periphery by a metal lead which is cut to form individual semi-conductor packages, and grooves extending longitudinally along the respective metal leads along the entire said periphery of at least some of said lead frames to decrease the thickness of said leads and minimize the formation of burrs during cutting.

6. The frame of claim 5 wherein each said lead frame defines terminals thereon, and said leads interconnect said terminals of adjacent lead frames to one another prior to cutting.

7. The frame of claim 5 wherein each said lead frame includes a die-pad thereon on which the respective semi-conductor device is mounted.

8. The frame of claim 5 wherein said grooves are disposed on rear or lower sides of said lead frames and are formed by half-etching.

9. The frame of claim 5 wherein said grooves are disposed on front or upper sides of said lead frames and are formed by half-etching.

10. The frame of claim 8 wherein said metal leads are cut with a dicing saw to obtain individual semi-conductor packages, and a width of the respective grooves is greater than a width of the dicing saw.

11. The frame of claim 8 wherein said metal leads are cut with a dicing saw to obtain individual semi-conductor packages, and a width of the respective grooves is less than a width of the dicing saw.

12. A frame for forming individual semi-conductor packages comprising an array of lead frames and molded semi-conductor devices respectively provided on the individual lead frames, and a plurality of metal leads arranged in a grid formation so as to define the boundaries of the respective lead frames, each said lead frame defining terminals thereon and said metal leads interconnect terminals of adjacent lead frames to one another, said metal leads being half-etched such that grooves are defined in and extend along the respective metal leads between interconnected terminals of adjacent lead frames, whereby cutting along said metal leads results in individual semi-conductor packages.

13. The frame of claim 12 wherein said grooves are provided in a back side of said lead frames.

14. The frame of claim 12 wherein said grooves are provided in a front side of said lead frames.

15. The frame of claim 12 wherein said metal leads are cut with a dicing saw to obtain individual semi-conductor packages, and a width of the respective grooves is one of less than or greater than a width of the dicing saw.

16. The frame of claim 15 wherein each said lead frame includes a die-pad thereon on which the respective semi-conductor device is mounted.

17. A frame for semiconductor packages as claimed in claim 1, where the groove portions are disposed on a back side of the frame.

18. The frame of claim 5, wherein said grooves are disposed on rear sides of said lead frames.

19. A frame for semiconductor packages as claimed in claim 1, wherein each said lead frame includes a die-pad thereon on which the respective semiconductor device is mounted, and wires which electrically connect said semi-conductor device with said terminals of the corresponding lead frame.

20. The frame of claim 6, wherein each said lead frame includes wires which electrically connect the respective semiconductor devices to said terminals of the corresponding lead frame.

21. The frame of claim 12, wherein each said lead frame includes a die-pad thereon on which the respective semi-conductor device is mounted, and wires which electrically connect said semiconductor device with said terminals of the corresponding lead frame.

22. A frame for semiconductor packages as claimed in claim 1 wherein each said lead frame is defined at its periphery by a said grid-lead having molding compound thereon, and said groove portions extend along the entire said periphery of each said lead frame.

23. The frame of claim 6 wherein said grooves extend across substantially the entire transverse width of the respective metal leads and between interconnected terminals of adjacent lead frames.

24. The frame of claim 12 wherein said grooves extend along the entire boundary of each said lead frame.

25. A frame for forming individual semi-conductor packages comprising a plurality of lead frames arranged in a mutually-adjacent array formation, each said lead frame mounting thereon a molded semi-conductor device and including a plurality of terminals, a plurality of metal leads which respectively extend between adjacent lead frames and define respective outer peripheries thereof, each said metal lead interconnecting terminals of adjacent lead frames with one another, and each said metal lead defining therein an elongate and linear groove which opens towards a rear side of said frame and extends between interconnected and oppositely projecting terminals of adjacent lead frames.

26. A method of forming individual semi-conductor packages, said method comprising the steps of:

providing a frame including a plurality of lead frames arranged in a mutually-adjacent array formation, each of the lead frames being defined at its periphery by a metal lead which interconnects terminals of adjacent lead frames to one another;

mounting semi-conductor devices on die pads of the respective lead frames;

collectively molding the lead frames with molding compound including the metal leads;

defining an elongate and linear groove in each of the metal leads such that the groove extends between interconnected terminals of adjacent lead frames; and forming individual semi-conductor packages by cutting the frame along the respective metal leads to separate the respective lead frames from one another, said step of forming including cutting through the respective metal leads and molding compound disposed thereon.

27. The frame of claim 26 wherein said step of defining includes defining said grooves such that same open towards a rear side of the frame, and said step of forming includes cutting through the respective metal leads and the molding compound disposed thereon from a front side of the frame.

* * * * *